IMPEDANCE MATCHING CIRCUIT IN AN OSCILLATOR UTILIZING GANGED INDUCTORS

Filed June 6, 1961

*INVENTOR,*
WILLIAM A. STIRRAT

*BY* Jack H. Linscott

ATTORNEY.

United States Patent Office 3,063,022

Patented Nov. 6, 1962

3,063,022

IMPEDANCE MATCHING CIRCUIT IN AN OSCILLATOR UTILIZING GANGED INDUCTORS

William A. Stirrat, Neptune City, N.J., assignor to the United States of America as represented by the Secretary of the Army Filed June 6, 1961, Ser. No. 115,273
6 Claims. (Cl. 331—96)

(Granted under Title 35, U.S. Code (1952), sec. 266)

The invention described herein may be manufactured and used by or for the Government for governmental purposes, without the payment of any royalty thereon.

This invention relates to tuned circuits and particularly to tuned circuits for establishing the frequency of an oscillator. More particularly, this invention relates to inductively tuned oscillators and to load compensation for such oscillators.

In the broadest sense, tuned circuits have inductive, or capacitive, or a combination of inductive and capacitive tuning. The capacitive tuning is the simplest and sturdiest, and it requires no sliding contacts; however, it has a comparatively limited frequency range, a relatively low "Q," an appreciable number of mechanical problems, and a variable output impedance and voltage level over its tuning range.

The inductive tuning has a comparatively wider tuning range, particularly at high frequencies, and a higher "Q"; however, it is bulky, its sliding contacts are a source of trouble, and it has other mechanical problems, as well as the variation in output impedance and voltage level over its tuning range.

The combination of a variable condenser and a variable inductor provides the greatest variation in frequency range, but with double the mechanical problems, spurious oscillation problems, and non-linear variations in output voltage over its tuning range as well as, usually, variations in output impedance.

Various attempts have been made to stabilize the output impedance of a tuned circuit or the output voltage of an oscillator incorporating a tuned circuit. These include, mainly, the use of "thermistors" or "varistors"; the use of low impedance output connections; or the use of automatic gain control techniques.

The "thermistors" or "varistors" are extremely simple, non-linear elements that function automatically, but they required a very appreciable change in state before they can begin to correct or control it. In addition, these devices are relatively inefficient.

Pads or attenuators may also be used to isolate the output of an oscillator from its load, to provide a constant load for the oscillator, and an apparently constant source impedance for the load. These devices are also only approximations and must be relatively inefficient to be effective.

The automatic volume control techniques incorporate the well known function of sampling the output level of the oscillator and feeding back a control signal to counteract any detectable changes in the output level. This is fairly constant, but requires additional, complex circuitry. It cannot increase output level, and so must reduce output level to equal that of the lowest value throughout the tuning range.

The low impedance output may be achieved by transformer coupling or other techniques well known in the art. This low impedance can be coupled to a relatively high resistance in series with the load, so that the variations in the impedance of the output of the tuned circuit become negligible in relation to the total impedance which includes the constant resistance. This system is still not an ideally constant impedance, and it is obviously very inefficient.

It is therefore an object of this invention to provide an improved tuned circuit.

It is a further object of this invention to provide an improved tuned circuit providing a constant output impedance over its entire frequency range.

It is a further object of this invention to provide an improved oscillator having a constant output load impedance over its entire frequency range.

It is a further object of this invention to provide an improved oscillator having a comparatively wide frequency range and maintaining a substantially constant output impedance and voltage over the entire range.

It is a further object of this invention to provide a comparatively simple, constant-output-voltage oscillator, incorporating readily available elements and tunable over a wide range.

These and other objects of this invention are accomplished by the use of ganged inductive coils, such as are found in "Inductuner," with at least one of the coils connected as an auto-transformer to a constant load. The load is across the whole coil and one part of the coil is connected in series with another of the coils that serves as the variable inductance of a tuned circuit.

This invention will be better understood and other and further objects of this invention will become apparent from the following specification and the drawings, of which:

Figure 1:
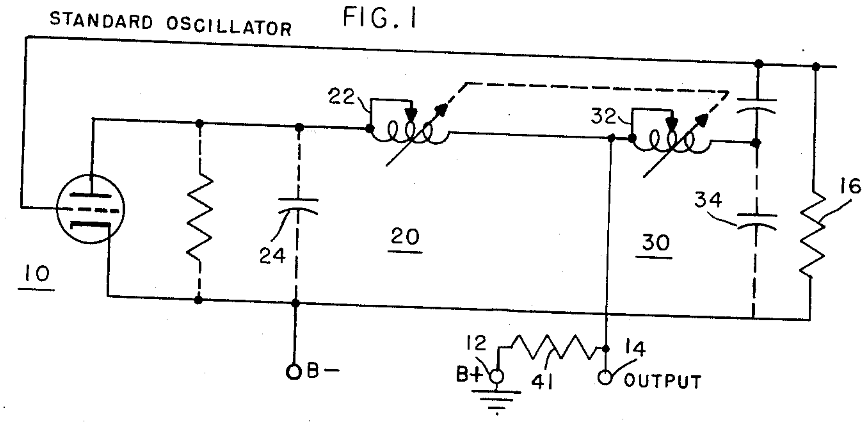
FIGURE 1 represents a basic phase shift oscillator.

Referring now more particularly to FIGURE 1, a typical phase shift oscillator is shown having an amplifying device 10, in the form of a vacuum tube, with a first tuned circuit 20 in its plate circuit, and a second tuned circuit 30 in its grid circuit. The coupling between the two tuned circuits include the resistance 41, across which the output terminals 12 and 14 are connected. A grid resistor 16 is connected between the grid and the cathode of tube 10.

The first tuned circuit includes the inductor 22 and the condenser 24, which is, in this case, the distributed capacitance of the circuit, and is shown in dotted lines.

The second tuned circuit includes the inductor 32 and the condenser 34, which is also made up of the distributed capacitance of the circuit. The amplifying device 10 feeds energy back from its output, the plate, through the frequency selective networks 20 and 30, to the input or grid circuit. All frequencies, except that of the tuned circuits will be blocked by these circuits.

The detailed analysis of the actual operation of oscillators of this type together with the very many minor variations of circuitry, and the changes that can be realized by such variations, are well known, and are available in many text books. Since almost all of these variations are applicable to this invention, within the skill of the art, and since they do not have any significant effect on the function of this invention, they will not be discussed in detail in this specification.

The output tuned circuit sees mainly the load of the resistance 41; since the loading by the grid tuned circuit is negligible in this case. Under certain optimum conditions, the voltage generated by the oscillator will be a maximum. However, as the frequency of the tuned circuits is changed by changing the inductance of the inductors, the voltage, generated by the oscillator and appearing across the load resistor, decreases.

Figure 2:
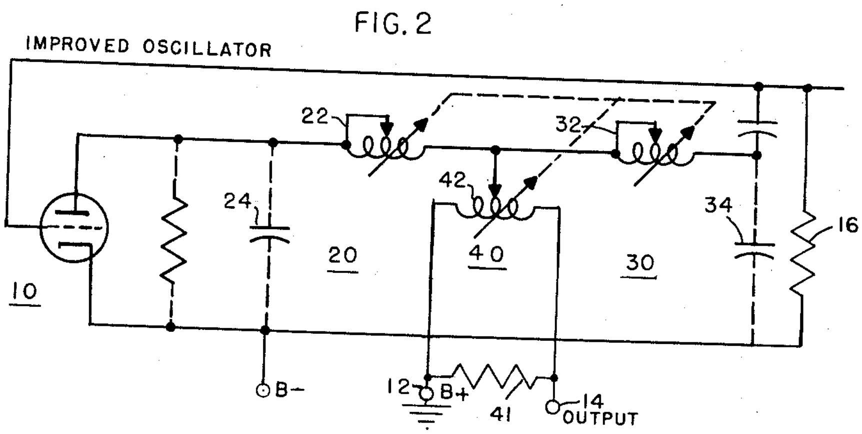
FIGURE 2 represents the same oscillator, with the variable, compensating load impedance added.

This is compensated for by the improved oscillator of the circuit of FIGURE 2 which incorporates the compensating device 40 of this invention. All of the other elements of FIGURE 2 correspond to the elements of FIGURE 1 and have the same numbers.

The compensating circuit 40 of FIGURE 2 includes a variable inductor, 42, which is connected across the resistor 41. The inductor is connected as an auto-transformer with a portion of its winding connected in series with the inductors 22 and 32 of the tuned circuits 20 and 30. The full winding of the inductor 42 is connected across the load 41.

The inductor 42 is variable, and is ganged to the other inductors so that they all vary together. The best way of accomplishing this is with the conventional, "INDUCTUNER" type of a device, mentioned in connection with the circuit of FIGURE 1. In the case of FIGURE 2, one of the coils of the "INDUCTUNER" may be modified to have both ends free rather than having one end connected to the movable center-tap, as is normal for such coils, to prevent arcing in the event of poor contacts when any considerable current is being carried. The ends of the coil 42 are connected across the load resistor 41, and the sliding center-tap and one of the ends provide the auto-transformer action.

In operation, at the lowest frequency of oscillation, the inductances are at a maximum, the auto-transformer has a 1 to 1 ratio, the tube is loaded for the transfer of maximum available power, and nearly all of this power is applied to the load 41. If the inductances 22 and 32 were decreased to increase the frequency, and if the 1 to 1 ratio in the auto-transformer were maintained, the tube would cease to be loaded for maximum power transfer, the power transferred to the load 41 would drop, the voltage level of the plate would decrease, and an overall loss of circuit efficiency would result. By coupling the adjustment of the auto-transformer to the tuning adjustment, the ratio of the windings of the auto-transformer is increased as the frequency is increased, which decreases the effective resistance to compensate for the decrease in reactance that caused the increased frequency. Thereby, the circuit efficiency and the voltage across the load 41 are maintained at a constant, optimum level throughout the tuning range.

In order to obtain low frequency ranges without increasing the capacitance in the plate circuit, which would decrease the "Q" of the circuit, an additional unit may be added in the plate circuit. The grid circuit in which the "Q" is not critical can be brought into the same range by the expedient of increasing the capacity of 34.

Figure 3:
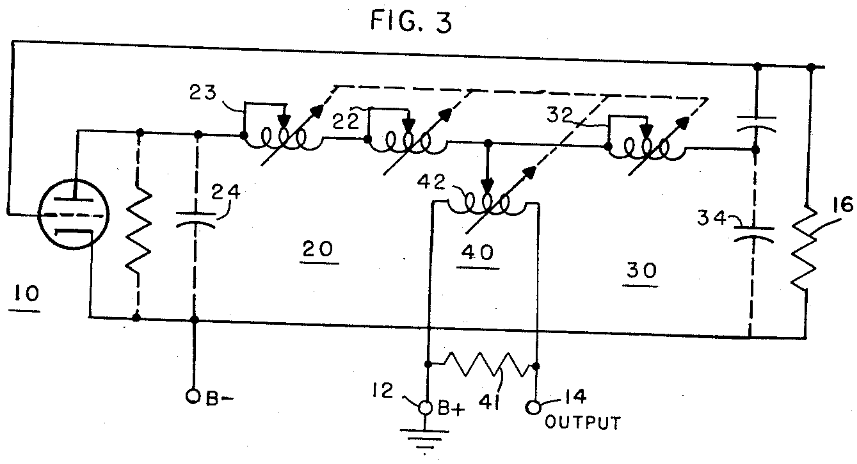
FIGURE 3 represents a variation of the oscillator of FIGURE 2 using 4 sections of an "Inductuner" to improve the results obtainable from a practical standpoint.

Such a non-symmetrical arrangement is shown in FIGURE 3 with two variable inductor coils 22 and 23 connected in series in the first, or plate tuned circuit 20. All of the other elements, including those of the compensating circuit are identical to those in FIGURE 2 and have the same numbers. In the case of FIGURE 3, still another coil of the same "INDUCTUNER," with the same tracking characteristics as found in the other coils, may be used to provide an increased change in the inductance in the plate tuned circuit 20.

Although the preferred embodiment of this circuit is shown as a part of the well known phase shift oscillator, these concepts may be utilized in other ways and in many other types of circuits. As a tuned circuit alone, which has innumerable uses in electronic circuitry, the connections would be essentially the same as those of the first or plate circuit of FIGURES 2 or 3. This would include the inductor 22—or the inductors 22 and 23—and the associated capacitance of 24, the compensating auto-transformer connected inductor 42, and the output load resistor 41. The input to such a tuned circuit would be substituted for the amplifying tube 10.

In a typical embodiment of this invention, the coils may be of the type found in the Mallory VHF "INDUCTUNER" which have a maximum inductance of 1 microhenry each. The capacitance of 24 and 34 would be in the order of 8 and 16 micro-microfarads respectively. The resistor 41 would be 50 ohms, the resistor 16 would be in the order of 1200 ohms and a type 2C39A tube, with suitable supply voltages, may be used. This oscillator functioned between 40 and 130 megacycles.

What is claimed is:

1. In combination with a tuned circuit having a variable reactance, an output load comprising a variable inductor having a variable tap, a resistive load connected across said variable inductor, the portion of said inductor between said variable tap and one of the ends of said inductor connected in series with the variable reactance of said tuned circuit, and ganged coupling means between said variable tap and said variable reactance, for changing the position of the variable tap of said inductor simultaneously with any change in the variable reactance tuned circuit.

2. In combination with a tuned circuit having capacitive and inductive reactances, means for varying said inductive reactance to vary the resonant frequency of said tuned circuit, a loading circuit coupled to said tuned circuit comprising an inductor having a variable tap, the portion of said inductor between one of its ends and said variable tap connected in series with the capacitive and inductive reactances of said tuned circuit, and mechanical means for ganging together said means for varying said inductive reactance and the variable tap of said inductor to cause the position of the variable tap of said inductor to vary with the inductive reactance of said tuned circuit.

3. In combination with a tuned circuit controlled by a first variable inductor, means for controlling the inductance of said first variable inductor, a second variable inductor having a variable tap and two end terminals, a resistance connected across said two end terminals of said second inductor, the variable tap and one end of said second inductor connected in series with said first variable inductor in said tuned circuit, and means for varying the position of said variable tap ganged together with said means for controlling the inductance of said first variable inductor.

4. In a tuned circuit as in claim 3, said means for controlling the inductance of said first variable inductor comprising a sliding tap and means for moving said sliding tap in continuous contact with the coiled conductor of said first inductor, said means for moving said sliding tap ganged together with said means for varying the position of said variable tap of said second coil.

5. A constant output oscillator comprising at least one tuned circuit having a first variable inductor having a mechanically controlled sliding tap for controlling the resonant frequency of said tuned circuit, a second variable inductor having a mechanically controlled sliding tap, a resistor connected across the ends of said second inductor, the sliding tap of said second inductor and one end of said second inductor connected in series with the first inductor in said tuned circuit, to provide a load impedance varying with and compensating for the variations of the inductive impedance, and of the output voltage, of said oscillator.

6. A constant output oscillator comprising a vacuum tube having an input and an output connection relative to a ground potential, a first and a second inductor, each controlled by a variable tap, connected in series between said output and said input connections of said vacuum tube, both of said inductors having substantial distributed capacity and forming tuned circuits resonant at the same frequency, a third inductor having a variable tap connected to the junction of said first and second inductors, one end of said third inductor connected to ground, and a resistor connected across both ends of said third inductor, the variable taps of said three inductors ganged together, the inductance between said one end and said variable tap of said third inductor increasing as the inductances of said first and said second inductors decrease.

No references cited.